(12) United States Patent
Watari

(10) Patent No.: US 12,041,719 B2
(45) Date of Patent: Jul. 16, 2024

(54) MEMORY SYSTEM

(71) Applicant: Kioxia Corporation, Tokyo (JP)

(72) Inventor: Gen Watari, Chigasaki (JP)

(73) Assignee: Kioxia Corporation, Tokyo (JP)

( * ) Notice: Subject to any disclaimer, the term of this patent is extended or adjusted under 35 U.S.C. 154(b) by 162 days.

(21) Appl. No.: 17/472,197

(22) Filed: Sep. 10, 2021

(65) Prior Publication Data

US 2022/0312589 A1 Sep. 29, 2022

(30) Foreign Application Priority Data

Mar. 23, 2021 (JP) ................................ 2021-048940

(51) Int. Cl.
| | |
|---|---|
| *H05K 1/00* | (2006.01) |
| *H05K 1/02* | (2006.01) |
| *H05K 1/11* | (2006.01) |

(52) U.S. Cl.
CPC ........... *H05K 1/0296* (2013.01); *H05K 1/117* (2013.01); *H05K 2201/10159* (2013.01)

(58) Field of Classification Search
CPC .............. H05K 1/0296; H05K 1/117; H05K 2201/10159
See application file for complete search history.

(56) References Cited

U.S. PATENT DOCUMENTS

| | | |
|---|---|---|
| 2003/0116835 A1 | 6/2003 | Miyamoto et al. |
| 2007/0091704 A1 | 4/2007 | RaghuRam et al. |
| 2013/0194515 A1 | 8/2013 | Hayashiyama et al. |
| 2013/0194517 A1 | 8/2013 | Hayashiyama et al. |
| 2016/0267372 A1* | 9/2016 | Imaizumi ............... H01Q 9/285 |
| 2017/0256527 A1* | 9/2017 | Tsukada .............. H01L 25/0655 |
| 2019/0385645 A1* | 12/2019 | Park ..................... G11C 29/021 |

FOREIGN PATENT DOCUMENTS

| | | |
|---|---|---|
| JP | 7-37337 Y2 | 8/1995 |
| JP | 2506915 Y2 | 8/1996 |
| JP | 10-284681 A | 10/1998 |
| JP | 5300995 B2 | 9/2013 |
| TW | 201336037 A | 9/2013 |
| TW | 201705133 A | 2/2017 |
| TW | 202025455 A | 7/2020 |

OTHER PUBLICATIONS

JP H1167954A; English Translation (Year: 1999).*
JPH10284682A English Translation (Year: 1998).*

* cited by examiner

*Primary Examiner* — Pete T Lee
(74) *Attorney, Agent, or Firm* — Oblon, McClelland, Maier & Neustadt, L.L.P.

(57) ABSTRACT

A memory system includes a substrate having a first and second surface, a memory controller, a nonvolatile memory, a first and second part, first and first, second, third, and fourth electrodes. The substrate includes a core portion, first and second pads on the first surface, and third and fourth pads on the second surface. The first electrodes couples the first pads and the memory controller. The second electrodes couples the second pads and the nonvolatile memory. The third electrodes couples the third pads and the first part. The fourth electrodes couples the fourth pads and the second part. The first and third pads are arranged at positions symmetrical to each other with respect to the core portion. The second and fourth pads are arranged at positions symmetrical to each other with respect to the core portion.

23 Claims, 7 Drawing Sheets

MEMORY SYSTEM

CROSS-REFERENCE TO RELATED APPLICATIONS

This application is based upon and claims the benefit of priority from Japanese Patent Application No. 2021-048940, filed Mar. 23, 2021, the entire contents of which are incorporated herein by reference.

FIELD

Embodiments described herein relate generally to a memory system.

BACKGROUND

Memory systems that incorporate a nonvolatile memory for storing data in a nonvolatile manner and a memory controller for controlling the nonvolatile memory have been known. A nonvolatile memory and a memory controller are mounted on a printed board, and electrically coupled to a host device by way of the printed board.

DETAILED DESCRIPTION

In general, according to one embodiment, a memory system includes a substrate, a memory controller, a nonvolatile memory, a first part, a second part, a plurality of first electrodes, a plurality of second electrodes, a plurality of third electrodes, and a plurality of fourth electrodes. The substrate has a first surface and a second surface on an opposite side with respect to the first surface. The substrate includes a core portion, a plurality of first pad electrodes on the first surface, a plurality of second pad electrodes on the first surface, a plurality of third pad electrodes on the second surface, and a plurality of fourth pad electrodes on the second surface. The plurality of first electrodes are configured to respectively couple the first pad electrodes and the memory controller. The plurality of second electrodes are configured to respectively couple the second pad electrodes and the nonvolatile memory. The plurality of third electrodes are configured to respectively couple the third pad electrodes and the first part. The plurality of fourth electrodes are configured to respectively couple the fourth pad electrodes and the second part. The first pad electrodes and the third pad electrodes are arranged at positions symmetrical to each other with respect to the core portion. The second pad electrodes and the fourth pad electrodes are arranged at positions symmetrical to each other with respect to the core portion.

Hereinafter, embodiment will be described with reference to the drawings. In the description below, constitution elements having the same functions and configurations will be denoted by a common reference symbol. The embodiment below is to embody technical concept. The embodiment does not specify the materials, forms, structures, arrangements or the like of the constitution elements, and various modifications may be made to the embodiment.

1. Embodiment

1.1 Configuration

1.1.1 Information Processing System

The configuration of an information processing system according to an embodiment will be described.

Figure 1:
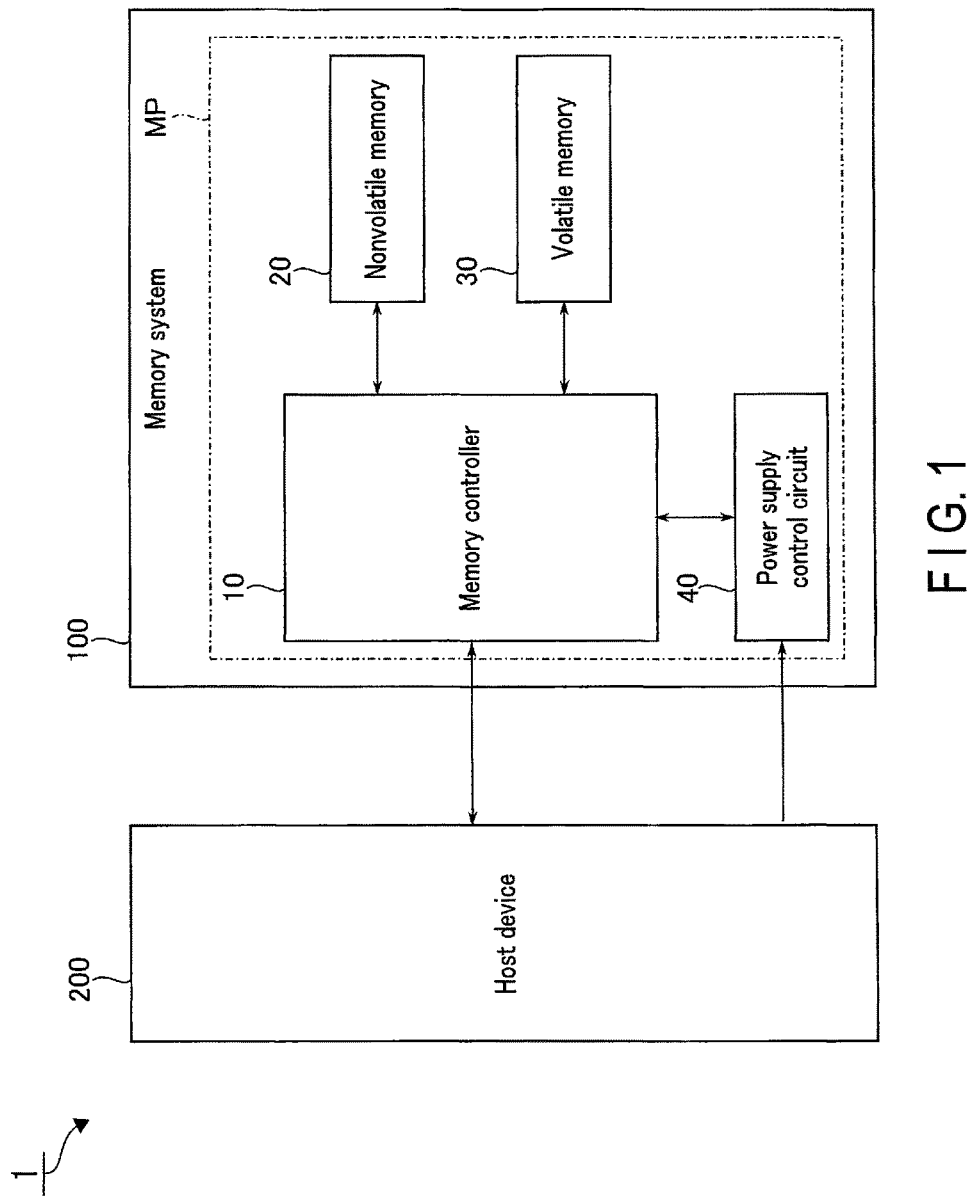
FIG. 1 is a block diagram showing an exemplary configuration of an information processing system according to an embodiment.

FIG. 1 is a block diagram showing the configuration of the information processing system according to the embodiment. The information processing system 1 includes a memory system 100 and a host device 200.

The memory system 100 is a memory device. The memory system 100 is a solid state drive (SSD), for example, which serves as a memory region of the host device 200. The memory system 100 executes a write process and read process for data in response to respective requests from the host device 200.

The host device 200 is an information processing device provided external to the memory system 100. The host device 200 is, for example, a server or a personal computer in a data center.

1.1.2 Internal Configuration of Memory System

The internal configuration of the memory system 100 will be described with reference to FIG. 1.

The memory system 100 includes a memory controller 10, a nonvolatile memory 20, a volatile memory 30, and a power supply control circuit 40. The memory system 100 may include two or more nonvolatile memories 20. Hereinafter, the memory controller 10, nonvolatile memory 20, volatile memory 30, and power supply control circuit 40 may be together referred to as parts MP.

The memory controller 10 may be an integrated circuit (IC) chip such as a system-on-a-chip (SoC). The memory controller 10 controls the nonvolatile memory 20 in response to a received request. For instance, the memory controller 10 writes, to the nonvolatile memory 20, data requested to be written. The memory controller 10 also reads, from the nonvolatile memory 20, data requested to be read.

The nonvolatile memory 20 is a NAND-type flash memory, for example. In place of a NAND-type flash memory, the nonvolatile memory 20 may be a nonvolatile memory such as an electrically erasable programmable read-only memory (EEPROM™). The nonvolatile memory 20 stores data in a nonvolatile manner.

The volatile memory 30 is, for example, a dynamic random access memory (DRAM). The volatile memory 30 temporarily stores data.

The power supply control circuit 40 is an IC chip. The power supply control circuit 40 supplies power to the memory controller 10 based on the externally supplied power. The power supply control circuit 40 supplies power to the nonvolatile memory 20 and volatile memory 30 via the memory controller 10.

1.1.3 Layout of Parts of Memory System

Figure 2:
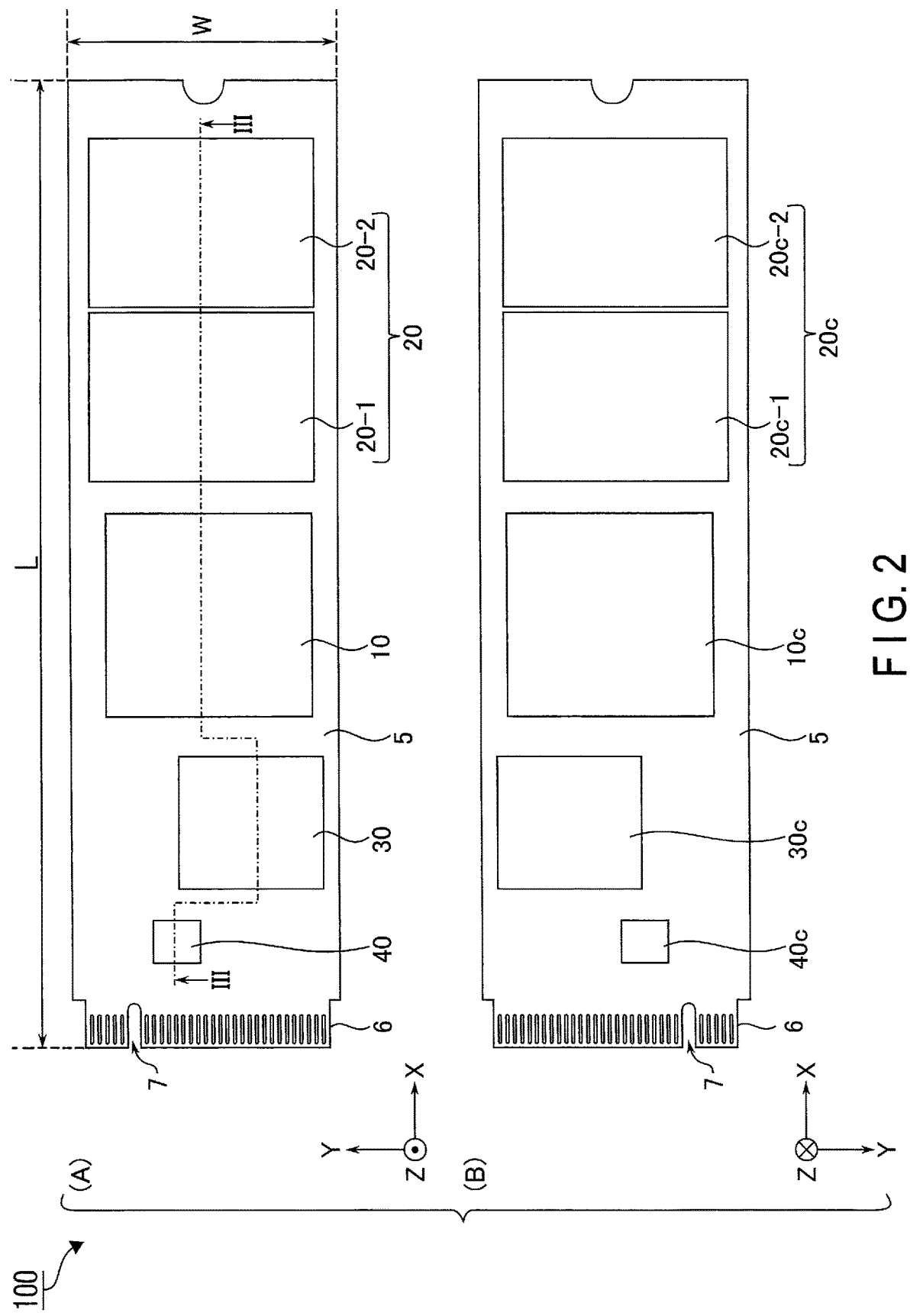
FIG. 2 is a plan view showing an exemplary layout of chips that constitute a memory system according to the embodiment.

Next, the layout of the memory system 100 according to the embodiment will be described. FIG. 2 is a plan view showing an exemplary layout of parts that constitute the memory system according to the embodiment. In FIG. 2, two nonvolatile memories 20-1 and 20-2 are incorporated as the nonvolatile memory 20. The memory system 100 further includes a substrate 5, and parts 10c, 20c, 30c, and 40c. The explanation will focus on the substrate 5, and parts 10c, 20c, 30c, and 40c.

The substrate 5 is a printed board. The substrate 5 is shaped into a rectangular parallelepiped having a rectangular first surface and a second surface opposite the first surface. Hereinafter, the longer-side direction of the first surface and second surface of the substrate 5 will be referred to as X direction. The shorter-side direction of the first surface and second surface of the substrate 5 will be referred to as Y direction. The direction of the first surface and second surface of the substrate 5 facing each other will be referred to as a Z direction. The plan view of the first surface of the substrate 5 as viewed in the Z direction is illustrated in the upper half (A) of FIG. 2. The plan view of the second surface of the substrate 5 as viewed in the Z direction is illustrated in the lower half (B) of FIG. 2. The shape of the substrate 5 may conform to the M.2 standard. In particular, combinations (W, L) of the length W of the shorter side of the substrate 5 and length L of the longer side shown in the plan view include, for example, (22 millimeters (mm), 42 mm), (22 mm, 60 mm), (22 mm, 80 mm), and (22 mm, 110 mm).

In the following description, "the second element and third element being symmetrical with respect to the first element" represents the second element and third element being plane-symmetrical with respect to the surface in the first element. The surface in the first element may be an XY plane that divides the first element into equal halves along the Z direction. The "second elements and third elements being symmetrical with respect to the first element" represents one element arbitrarily selected from the second elements and the corresponding element of the third element being symmetrical with respect to the first element. Being "symmetrical" includes being substantially symmetrical. In other words, a certain production error is allowed for the positional relationship of the second element and third element being symmetrical with respect to the first element. Production errors may include displacement of a pattern.

The part 10c is a counterweight of the memory controller 10. That is, the part 10c has approximately the same weight and shape as the memory controller 10. The part 10c is arranged at a position symmetrical to the memory controller 10 with respect to the substrate 5. The center of mass of the part 10c is symmetrical to the center of mass of the memory controller 10 with respect to the substrate 5.

The parts 20c-1 and 20c-2 are counterweights of the nonvolatile memories 20-1 and 20-2. That is, the parts 20c-1 and 20c-2 have approximately the same weights and shapes as the nonvolatile memories 20-1 and 20-2, respectively. The parts 20c-1 and 20c-2 are arranged at positions symmetrical to the nonvolatile memories 20-1 and 20-2 with respect to the substrate 5. The centers of mass of the part 20c-1 and part 20c-2 are symmetrical to the centers of mass of the nonvolatile memory 20-1 and nonvolatile memory 20-2, respectively, with respect to the substrate 5.

The part 30c is a counterweight of the volatile memory 30. That is, the part 30c has approximately the same weight and shape as the volatile memory 30. The part 30c is arranged at a position symmetrical to the volatile memory 30 with respect to the substrate 5. The center of mass of the part 30c is symmetrical to the center of mass of the volatile memory 30 with respect to the substrate 5.

The part 40c is a counterweight of the power supply control circuit 40. That is, the part 40c has approximately the same weight and shape as the power supply control circuit 40. The part 40c is arranged at a position symmetrical to the power supply control circuit 40 with respect to the substrate 5. The center of mass of the part 40c is symmetrical to the center of mass of the power supply control circuit 40 with respect to the substrate 5.

A connector 6 is arranged in a first end portion of the substrate 5 in the X direction. The connector 6 is configured to physically and electrically couple the memory system 100 to the host device 200. A slit 7 is provided at a position of the connector 6, away from the center of the connector 6 in the Y direction. The position of the slit 7 corresponds to the standard (e.g., PCI (Peripheral Component Interconnect) Express™ (PCIe)) of communications between the memory system 100 and host device 200.

The parts MP are arranged on the first surface of the substrate 5. The parts 10c, 20c, 30c, and 40c are arranged on the second surface of the substrate 5. Each of the parts MP, 10c, 20c, 30c, and 40c is mounted on the substrate 5 as a ball grid array (BGA).

The memory controller 10, which is one of the parts MP, is positioned near the center of the substrate 5 in the X direction with respect to the nonvolatile memories 20-1 and 20-2, volatile memory 30, and power supply control circuit 40.

The parts 10c, 20c, 30c, and 40c may be functional components. A functional component includes an electronic circuit. Each of the parts 10c, 20c, 30c, and 40c may be an IC chip, for example. The parts 10c, 20c, 30c, and 40c may be non-functional components. A non-functional component does not include an electronic circuit. The parts 10c, 20c, 30c, and 40c may be plate-like members. The parts 10c, 20c, 30c, and 40c may contain iron.

1.1.4 Cross-Sectional Configuration of Memory System

Figure 3:
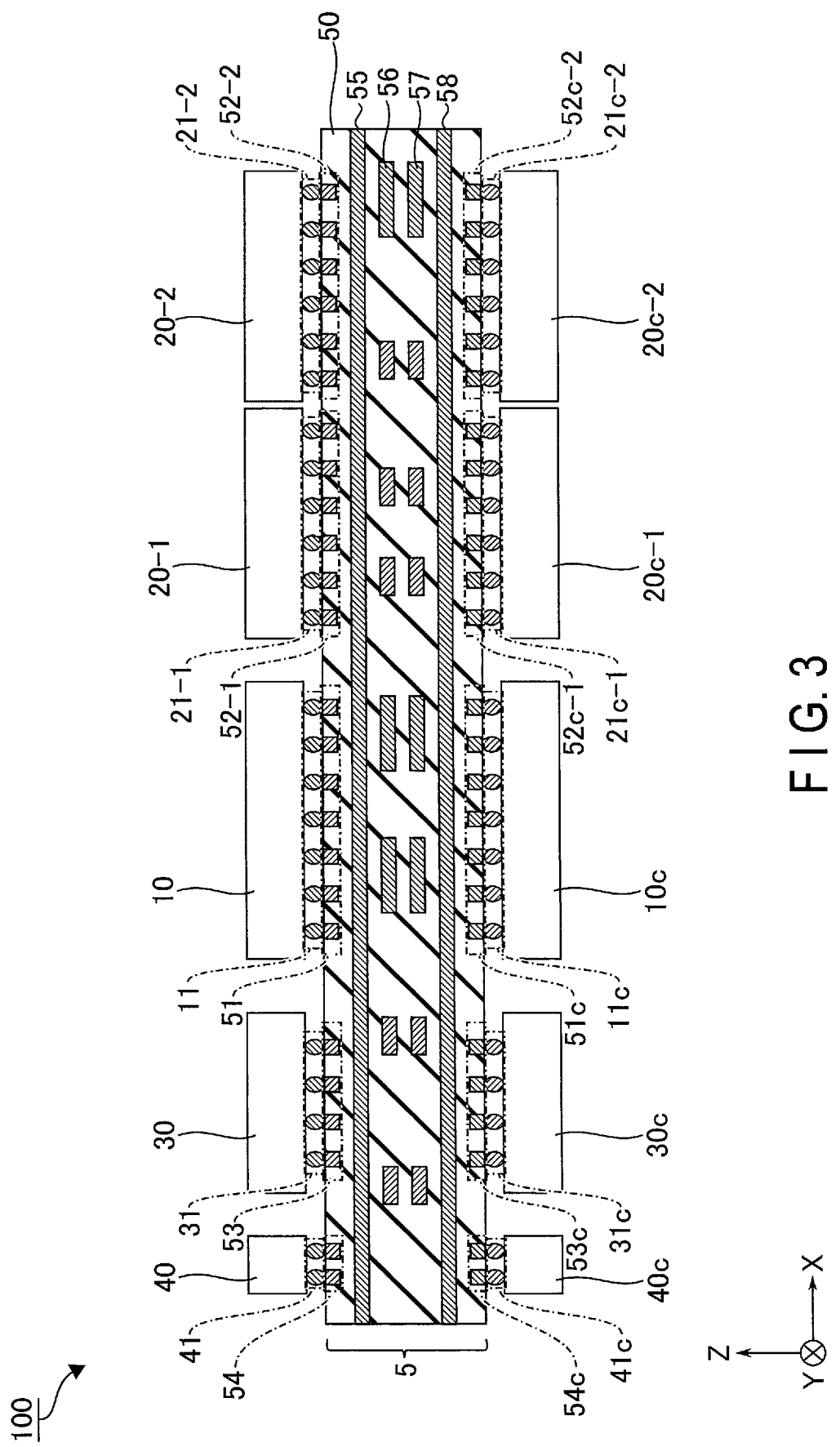
FIG. 3 is a cross-sectional view showing an exemplary cross section of the memory system according to the embodiment, taken along line III-III.

Next, the cross-sectional configuration of the memory system 100 according to the embodiment will be described. FIG. 3 is a cross-sectional view showing an exemplary cross section of the memory system according to the embodiment, taken along line III-III. The substrate 5 is a multi-layered substrate. The substrate 5 includes a core portion 50, pad electrodes 51, 52-1, 52-2, 53, 54, 51c, 52c-1, 52c-2, 53c, and 54c, and interconnect layers 55, 56, 57, and 58.

The core portion 50 is an insulator. The core portion 50 partially covers each of the pad electrodes 51, 52-1, 52-2, 53, 54, 51c, 52c-1, 52c-2, 53c, and 54c, and also partially or entirely covers each of the interconnect layers 55, 56, 57, and 58.

The pad electrodes 51, 52-1, 52-2, 53, and 54 are land electrodes. The pad electrodes 51, 52-1, 52-2, 53, and 54 are provided on the first surface of the substrate 5. The pad electrodes 51, 52-1, 52-2, 53, and 54 are exposed from the core portion 50 on the first surface of the substrate 5.

The pad electrodes 51c, 52c-1, 52c-2, 53c, and 54c are land electrodes. The pad electrodes 51c, 52c-1, 52c-2, 53c, and 54c are provided on the second surface of the substrate 5. The pad electrodes 51c, 52c-1, 52c-2, 53c, and 54c are exposed from the core portion 50 on the second surface of the substrate 5.

The interconnect layers 55, 56, 57, and 58 are conductors. The interconnect layers 55, 56, 57, and 58 are arranged at mutually different levels of the core portion 50. The interconnect layers 55, 56, 57, and 58 are electrically coupled to the pad electrodes 51, 52-1, 52-2, 53, and 54, and to the connector 6 through vias, which are now shown. The interconnect layers 55, 56, 57, and 58 may be electrically coupled, or may not be electrically coupled, to the pad electrodes 51c, 52c-1, 52c-2, 53c, and 54c through vias, which are now shown. Each of the interconnect layers 55 and 58 includes, for example, one wiring that expands in one plane at the arranged level. The wiring included in the interconnect layers 55 and 58 is configured to stabilize the ground voltage and power supply voltage. Each of the interconnect layers 56 and 57 includes, for example, a plurality of wirings distributed at the arranged level. The wirings of the interconnect layers 56 and 57 are configured to establish communications between the memory system 100 and host device 200.

Next, the coupling of the parts MP, 10c, 20c, 30c, and 40c with the substrate 5 will be described.

The memory controller 10 includes a plurality of ball electrodes 11. Each of the ball electrodes 11 is a solder ball. The ball electrodes 11 are arranged on one surface of the memory controller 10. The ball electrodes 11 are coupled to the corresponding pad electrodes 51. The memory controller 10 is thereby electrically coupled to the substrate 5.

The nonvolatile memory 20-1 and nonvolatile memory 20-2 include a plurality of ball electrodes 21-1 and a plurality of ball electrodes 21-2, respectively. Each of the ball electrodes 21-1 and 21-2 is a solder ball. The ball electrodes 21-1 and 21-2 are arranged on one surface of the nonvolatile memories 20-1 and 20-2, respectively.

The ball electrodes 21-1 and 21-2 are respectively coupled to the pad electrodes 52-1 and 52-2. The nonvolatile memories 20-1 and 20-2 are thereby electrically coupled to the substrate 5.

The volatile memory 30 includes a plurality of ball electrodes 31. Each of the ball electrodes 31 is a solder ball. The ball electrodes 31 are arranged on one surface of the volatile memory 30. The ball electrodes 31 are coupled to the corresponding pad electrodes 53. The volatile memory 30 is thereby electrically coupled to the substrate 5.

The power supply control circuit 40 includes a plurality of ball electrodes 41. Each of the ball electrodes 41 is a solder ball. The ball electrodes 41 are arranged on one surface of the power supply control circuit 40. The ball electrodes 41 are coupled to the corresponding pad electrodes 54. The power supply control circuit 40 is thereby electrically coupled to the substrate 5.

The part 10c includes a plurality of ball electrodes 11c. Each of the ball electrodes 11c is a solder ball. The ball electrodes 11c are arranged on one surface of the part 10c. The ball electrodes 11c are coupled to the corresponding pad electrodes 51c. The part 10c is thereby electrically coupled to the substrate 5.

The parts 20c-1 and 20c-2 include a plurality of ball electrodes 21c-1 and a plurality of ball electrodes 21c-2, respectively. Each of the ball electrodes 21c-1 and 21c-2 is a solder ball. The ball electrodes 21c-1 and 21c-2 are arranged on one surface of the parts 20c-1 and 20c-2, respectively. The ball electrodes 21c-1 and 21c-2 are coupled to the corresponding pad electrodes 52c-1 and 52c-2, respectively. The parts 20c-1 and 20c-2 are thereby electrically coupled to the substrate 5.

The part 30c includes a plurality of ball electrodes 31c. Each of the ball electrodes 31c is a solder ball. The ball electrodes 31c are arranged on one surface of the part 30c. The ball electrodes 31c are coupled to the corresponding pad electrodes 53c. The part 30c is thereby electrically coupled to the substrate 5.

The part 40c includes a plurality of ball electrodes 41c. Each of the ball electrodes 41c is a solder ball. The ball electrodes 41c are arranged on one surface of the part 40c. The ball electrodes 41c are coupled to the corresponding pad electrodes 54c. The part 40c is thereby electrically coupled to the substrate 5.

The parts 10c, 20c, 30c, and 40c, which function as electronic circuits, may be electrically coupled to the interconnect layers 55, 56, 57, and 58 so as to establish communications with the parts MP. The parts 10c, 20c, 30c, and 40c, which do not function as electronic circuits, may be electrically coupled to the interconnect layers 55 and 58 so as to be conducive to the stability of the ground voltage and power supply voltage.

1.1.5 Layout of Pad Electrodes on Substrate

Figure 4:
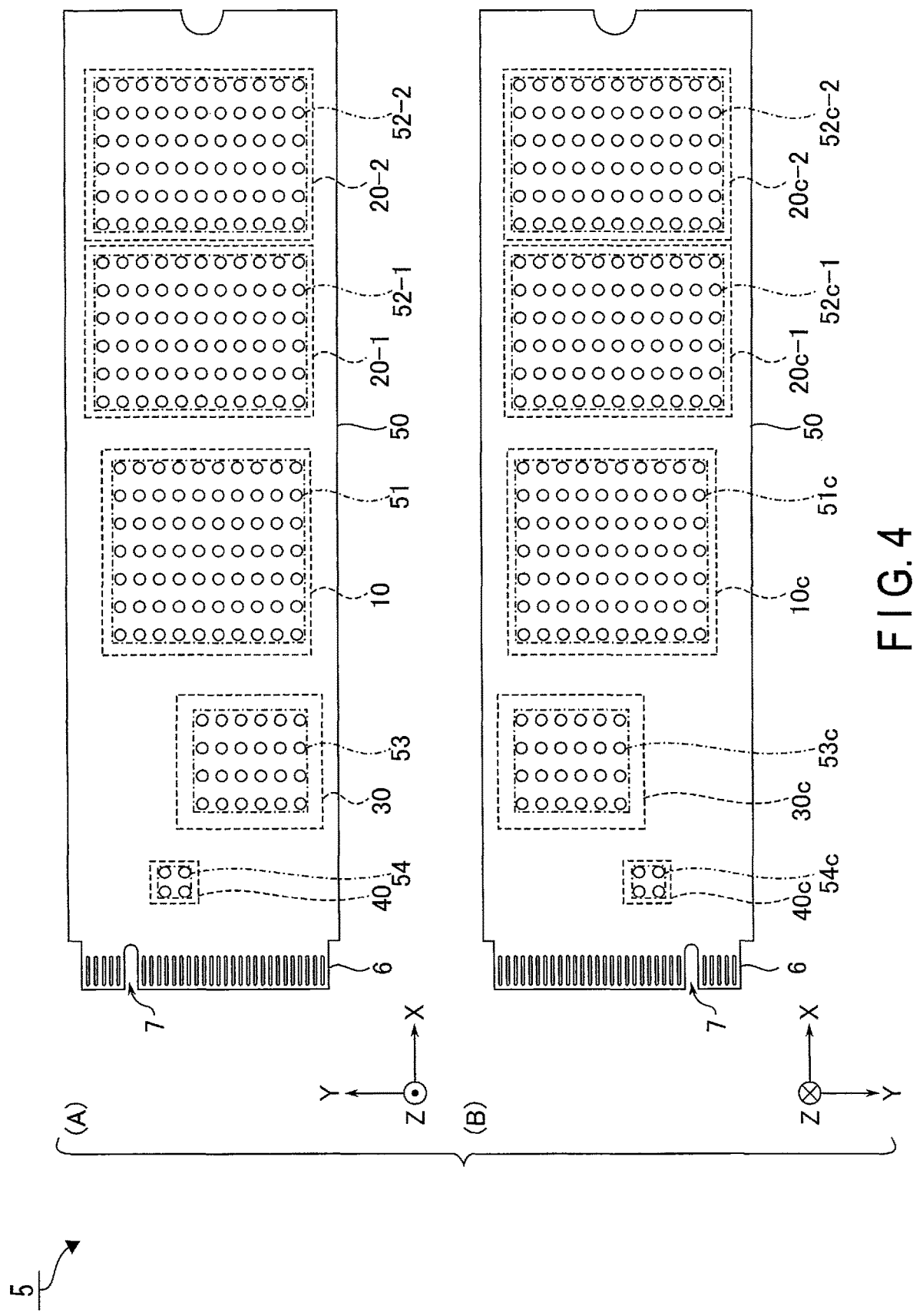
FIG. 4 is a plan view showing an exemplary layout of pad electrodes on a substrate according to the embodiment.

The layout of the pad electrodes 51, 52, 53, 54, 51c, 52c, 53, and 54c on the substrate 5 according to the embodiment will be described. FIG. 4 is a plan view showing an exemplary layout of pad electrodes on the substrate according to the embodiment. In particular, the plan view of a plurality of pad electrodes 51, 52, 53, and 54 on the first surface of the substrate 5 as viewed in the Z direction is illustrated in the upper half (A) of FIG. 4. The arrangement of the parts MP is indicated by broken lines in the upper half (A) of FIG. 4. The plan view of a plurality of pad electrodes 51c, 52c, 53c, and 54c on the second surface of the substrate 5 as viewed in the Z direction is illustrated in the lower half (B) of FIG. 4. The arrangement of the parts MP is indicated by broken lines in the lower half (B) of FIG. 4.

The pad electrodes 51 are arranged across a portion of the first surface of the substrate 5 that overlaps the memory controller 10 when viewed in the Z direction. On the other hand, the pad electrodes 51c are arranged across a portion of the second surface of the substrate 5 that overlaps the part 10c when viewed in the Z direction. Each of the pad electrodes 51c is arranged at a position symmetrical to the corresponding one of the pad electrodes 51 with respect to the core portion 50. The center of mass of the pad electrodes 5ic is located at the position symmetrical to the center of mass of the pad electrodes 51 with respect to the core portion 50. The number of pad electrodes 51c is equal to the number of pad electrodes 51.

The pad electrodes 52-1 and 52-2 are arranged across portions of the first surface of the substrate 5 that overlap the nonvolatile memories 20-1 and 20-2, respectively, when viewed in the Z direction. On the other hand, the pad electrodes 52c-1 and 52c-2 are arranged across portions of the second surface of the substrate 5 that overlap the parts 20c-1 and 20c-2, respectively, when viewed in the Z direction. Each of the pad electrodes 52c-1 is arranged at a position symmetrical to the corresponding one of the pad electrodes 52-1 with respect to the core portion 50. The center of mass of the pad electrodes 52c-1 is located at a position symmetrical to the center of mass of the pad electrodes 52-1 with respect to the core portion 50. Each of the pad electrodes 52c-2 is arranged at a position symmetrical to the corresponding one of the pad electrodes 52-2 with respect to the core portion 50. The center of mass of the pad electrodes 52c-2 is located at a position symmetrical to the center of mass of the pad electrodes 52-2 with respect to the core portion 50. The numbers of pad electrodes 52c-1 and 52c-2 are equal to the numbers of pad electrodes 52-1 and 52-2, respectively.

A plurality of pad electrodes 53 are arranged across a portion of the first surface of the substrate 5 that overlaps the volatile memory 30 when viewed in the Z direction. On the other hand, the pad electrodes 53c are arranged across a portion of the second surface of the substrate 5 that overlaps the part 30c when viewed in the Z direction. Each of the pad electrodes 53c is arranged at a position symmetrical to the corresponding one of the pad electrodes 53 with respect to the core portion 50. The center of mass of the pad electrodes 53c is located at the position symmetrical to the center of mass of the pad electrodes 53 with respect to the core portion 50. The number of pad electrodes 53c is equal to the number of pad electrodes 53.

A plurality of pad electrodes 54 are arranged across a portion of the first surface of the substrate 5 that overlaps the power supply control circuit 40 when viewed in the Z direction. On the other hand, the pad electrodes 54c are arranged across a portion of the second surface of the substrate 5 that overlaps the part 40c when viewed in the Z direction. Each of the pad electrodes 54c is arranged at a position symmetrical to the corresponding one of the pad electrodes 54 with respect to the core portion 50. The center of mass of the pad electrodes 54c is located at the position symmetrical to the center of mass of the pad electrodes 54 with respect to the core portion 50. The number of pad electrodes 54c is equal to the number of pad electrodes 54.

1.3. Effects of Present Embodiment

According to the embodiment, the pad electrodes 51, 52, 53, and 54 on the first surface are arranged at positions symmetrical to the pad electrodes 51c, 52c, 53c, and 54c on the second surface, with respect to the substrate 5. In this manner, a concentration of stress on either one of the first surface and second surface can be suppressed. In addition, the generation of defects due to impact and heat can also be suppressed.

The structure according to the embodiment can suppress the breakage of the ball electrodes 11, 21-1, 21-2, 31, and 41, as well as the interconnect layers 55, 56, 57, and 58.

The memory controller 10 tends to produce heat and become excessively hot. According to the embodiment, the memory controller 10 is arranged near the center of the substrate 5 in the longitudinal direction. This can suppress application of the thermal stress only to one side of the longitudinal direction. In this manner, warpage of the substrate 5 can be reduced.

In addition, according to the embodiment, the heat conducted from the parts MP to the substrate 5 can be effectively released to the side of the second surface.

2. Modification

The above embodiment can be modified in various manners. A modification will be described below. In this modification, a single part is provided on the second surface to correspond to the parts MP on the first surface.

Figure 5:
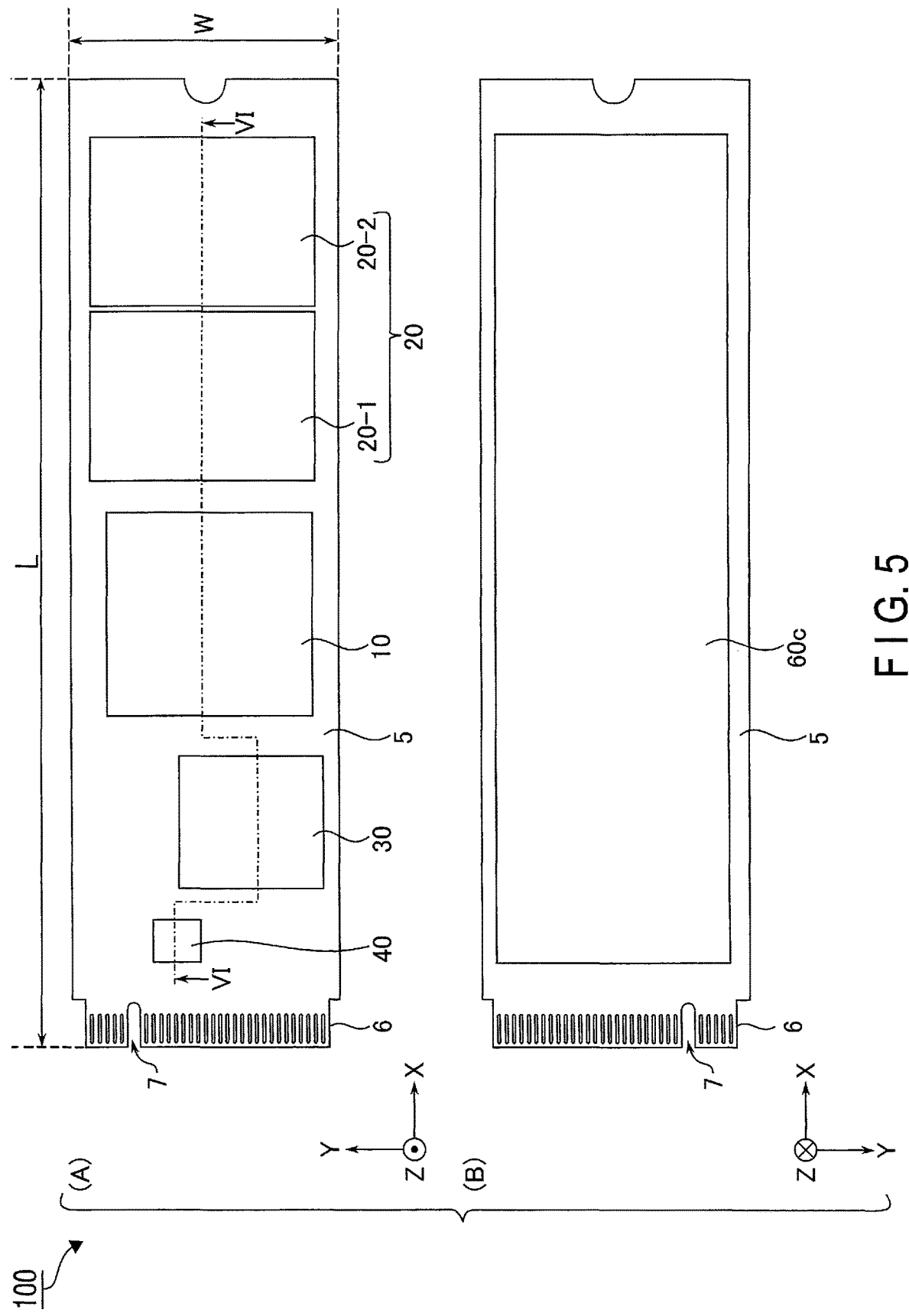
FIG. 5 is a plan view showing an exemplary layout of chips that constitute a memory system according to a modification.

FIG. 5 is a plan view showing an exemplary layout of parts that constitute a memory system according to a modification. The memory system 100 according to the modification includes, in addition to the substrate 5 and parts MP, a part 60c.

The part 60c is a counterweight of the parts MP. In other words, the part 60c has approximately the same weight as the total weight of the parts MP. The center of mass of the part 60c is symmetrical to the center of mass of the parts MP with respect to the substrate 5. The part 60c may be an electronic circuit. The part 60c may be an IC chip. The part 60c may be a plate-like member. The part 60c may contain iron. The part 60c is mounted on the substrate 5 as a BGA. The part 60c has a shape that can overlap the parts MP in a planar view.

Figure 6:
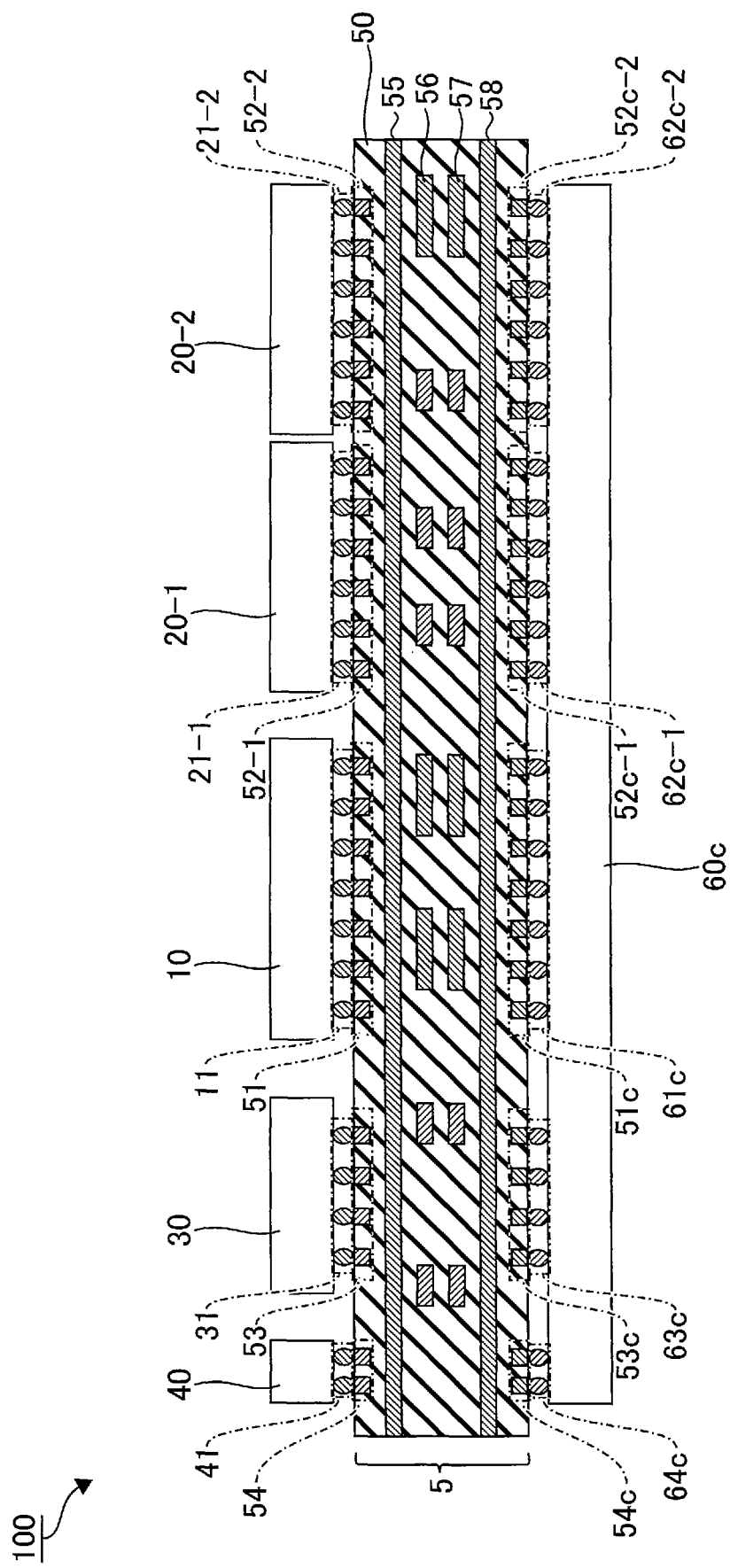
FIG. 6 is a cross-sectional view showing an exemplary cross section of the memory system according to the modification, taken along line VI-VI.

FIG. 6 is a cross-sectional view showing a cross section of the memory system according to the modification, taken along line VI-VI. The configuration of the substrate 5 is approximately the same as that of the embodiment.

The part 60c is electrically coupled to the substrate 5. The part 60c may be electrically coupled to the interconnect layers 55, 56, 57, and 58 so as to establish communications with the parts MP. The part 60c includes a plurality of ball electrodes 61c, 62c-1, 62c-2, 63c, and 64c.

Each of the ball electrodes 61c, 62c-1, 62c-2, 63c, and 64c is a solder ball. The ball electrodes 61c, 62c-1, 62c-2, 63c, and 64c are arranged on one surface of the part 60c. The ball electrodes 61c are coupled to the corresponding pad electrodes 51c. The ball electrodes 62c-1 are coupled to the corresponding pad electrodes 52c-1. The ball electrodes 62c-2 are coupled to the corresponding pad electrodes 52c-2. The ball electrodes 63c are coupled to the corresponding pad electrodes 53c. The ball electrodes 64c are coupled to the corresponding pad electrodes 54c.

Figure 7:
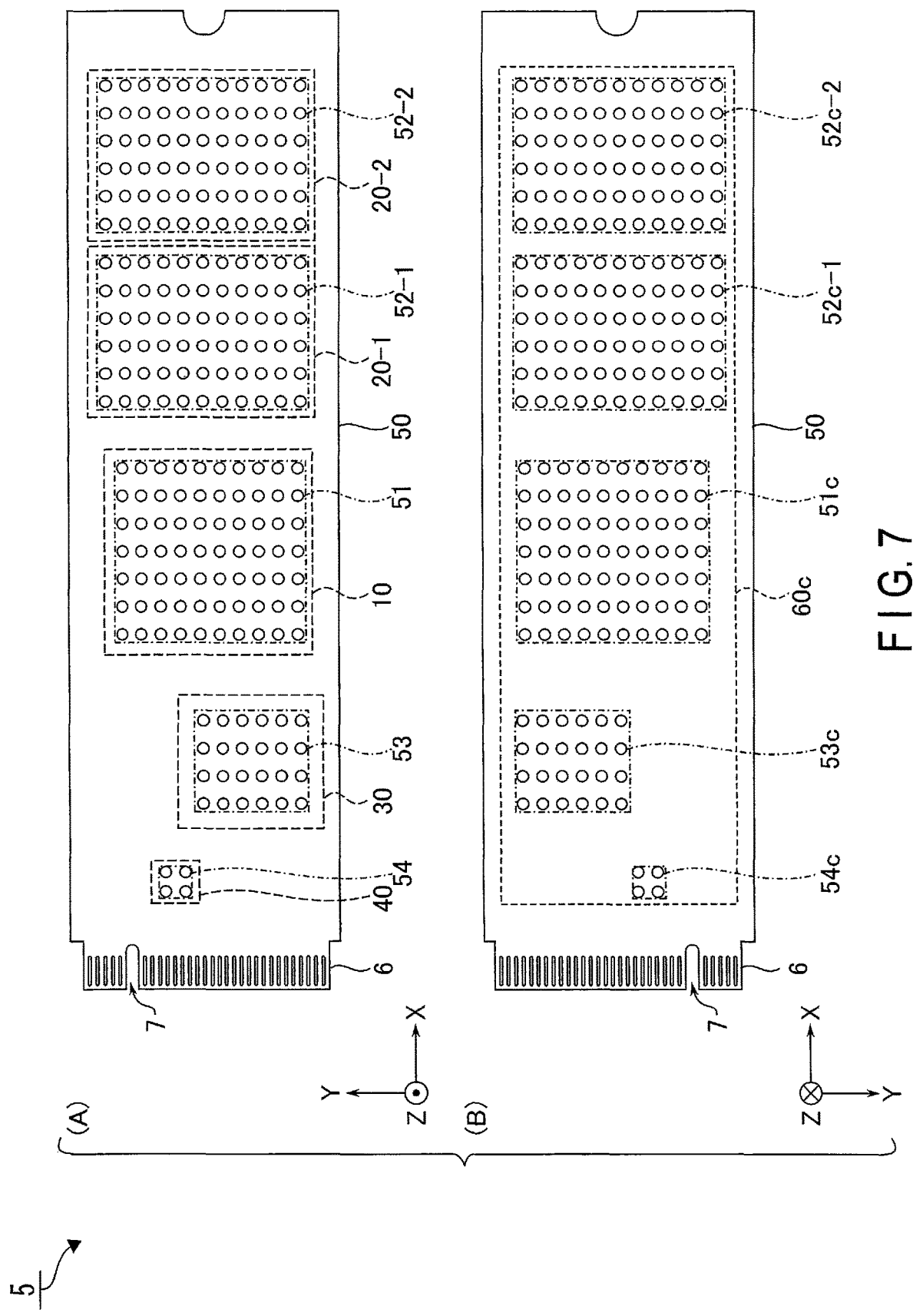
FIG. 7 is a plan view showing an exemplary layout of pad electrodes on a substrate according to the modification.

FIG. 7 is a plan view showing an exemplary layout of pad electrodes on the substrate according to the modification. The arrangement of the pad electrodes 51, 52, 53, 54, 51c, 52c, 53c, and 54c is approximately the same as that of the embodiment. That is, the part 60c is coupled to the substrate 5 by way of the pad electrodes 51c, 52c, 53c, and 54c arranged at positions symmetrical to the pad electrodes 51, 52, 53, and 54 with respect to the substrate 5.

According to the modification, the coupling portions of the substrate 5 and the part 60c can be determined at positions symmetrical to the coupling portions of the substrate 5 and the parts MP with respect to the substrate 5. In this manner, stress will not be concentrated on certain solder balls only.

In addition, according to the modification, warpage of the substrate 5 can be reduced. Thus, breakage of the ball electrodes 11, 21-1, 21-2, 31, and 41, as well as the interconnect layers 55, 56, 57, and 58 can be suppressed.

In addition, according to the modification, the heat conducted from the parts MP to the substrate 5 can be effectively released to the side of the second surface.

3. Others

Some of the parts MP may be arranged on the second surface of the substrate 5. In such a configuration, the warpage of the substrate 5 can still be suppressed by providing parts 10c, 20c, 30c, and 40c at positions symmetrical to the parts MP with respect to the substrate 5.

The embodiment is discussed merely as an example, which should not be considered to restrict the scope of invention.

The invention claimed is:

1. A memory system comprising:
   a substrate having a first surface and a second surface on an opposite side with respect to the first surface, the substrate including a core portion, a plurality of first pad electrodes on the first surface, a plurality of second pad electrodes on the first surface, a plurality of third pad electrodes on the second surface, and a plurality of fourth pad electrodes on the second surface;
   a memory controller;
   a nonvolatile memory;

a first part;
a second part;
a plurality of first electrodes configured to respectively couple the first pad electrodes and the memory controller;
a plurality of second electrodes configured to respectively couple the second pad electrodes and the nonvolatile memory;
a plurality of third electrodes configured to respectively couple the third pad electrodes and the first part; and
a plurality of fourth electrodes configured to respectively couple the fourth pad electrodes and the second part, wherein:
the first pad electrodes and the third pad electrodes are arranged at positions symmetrical to each other with respect to the core portion;
the second pad electrodes and the fourth pad electrodes are arranged at positions symmetrical to each other with respect to the core portion; and
a center of mass of the memory controller is located at a position symmetrical to a center of mass of the first part with respect to the core portion and a center of mass of the nonvolatile memory is located at a position symmetrical to a center of mass of the second part with respect to the core portion, or a total weight of the memory controller and the first electrodes is equal to a total weight of the first part and the third electrodes and a total weight of the nonvolatile memory and the second electrodes is equal to a total weight of the second part and the fourth electrodes.

2. The memory system according to claim 1, wherein
a number of first pad electrodes is equal to a number of third pad electrodes, and
a number of second pad electrodes is equal to a number of fourth pad electrodes.

3. The memory system according to claim 2, wherein
a weight of the memory controller is equal to a weight of the first part, and
a weight of the nonvolatile memory is equal to a weight of the second part.

4. The memory system according to claim 3, wherein
a shape of the memory controller is identical to a shape of the first part, and
a shape of the nonvolatile memory is identical to a shape of the second part.

5. The memory system according to claim 1, wherein
the first electrodes, the second electrodes, the third electrodes, and the fourth electrodes are solder balls.

6. The memory system according to claim 1, wherein
the first part and the second part are plate-like members containing iron.

7. The memory system according to claim 6, wherein
the substrate further includes an interconnect layer that is grounded, and
the first part and the second part are electrically coupled to the interconnect layer.

8. A memory system comprising:
a substrate having a first surface and a second surface on an opposite side with respect to the first surface, the substrate including a core portion, a plurality of first pad electrodes on the first surface, a plurality of second pad electrodes on the first surface, a plurality of third pad electrodes on the second surface, and a plurality of fourth pad electrodes on the second surface;
a memory controller;
a nonvolatile memory;
a first part;
a second part;
a plurality of first electrodes configured to respectively couple the first pad electrodes and the memory controller;
a plurality of second electrodes configured to respectively couple the second pad electrodes and the nonvolatile memory;
a plurality of third electrodes configured to respectively couple the third pad electrodes and the first part; and
a plurality of fourth electrodes configured to respectively couple the fourth pad electrodes and the second part, wherein:
the first pad electrodes and the third pad electrodes are arranged at positions symmetrical to each other with respect to the core portion;
the second pad electrodes and the fourth pad electrodes are arranged at positions symmetrical to each other with respect to the core portion;
the substrate further includes a plurality of fifth pad electrodes on the first surface and a plurality of sixth pad electrodes on the second surface;
the memory system further comprises:
  a volatile memory;
  a third part;
  a plurality of fifth electrodes configured to respectively couple the fifth pad electrodes and the volatile memory; and
  a plurality of sixth electrodes configured to respectively couple the sixth pad electrodes and the third part; and
the fifth pad electrodes and the sixth pad electrodes are arranged at positions symmetrical to each other with respect to the core portion.

9. The memory system according to claim 8, wherein
the substrate further includes a plurality of seventh pad electrodes on the first surface and a plurality of eighth pad electrodes on the second surface,
the memory system further comprises:
  a power supply control circuit;
  a fourth part;
  a plurality of seventh electrodes configured to respectively couple the seventh pad electrodes and the power supply control circuit; and
  a plurality of eighth electrodes configured to respectively couple the eighth pad electrodes and the fourth part, and
the seventh pad electrodes and the eighth pad electrodes are arranged at positions symmetrical to each other with respect to the core portion.

10. The memory system according to claim 9, wherein
the substrate further includes a connector having a slit that conforms to peripheral component interconnect express (PCIe).

11. The memory system according to claim 10, wherein
the substrate has a shape that conforms to M.2 standard.

12. A memory system comprising:
a substrate having a first surface and a second surface on an opposite side with respect to the first surface, the substrate including a core portion, a plurality of first pad electrodes on the first surface, a plurality of second pad electrodes on the first surface, a plurality of third pad electrodes on the second surface, and a plurality of fourth pad electrodes on the second surface;
a memory controller;
a nonvolatile memory;
a part;

a plurality of first electrodes configured to respectively couple the first pad electrodes and the memory controller;
a plurality of second electrodes configured to respectively couple the second pad electrodes and the nonvolatile memory;
a plurality of third electrodes configured to respectively couple the third pad electrodes and the part; and
a plurality of fourth electrodes configured to respectively couple the fourth pad electrodes and the part,
wherein the first pad electrodes and the third pad electrodes are arranged at positions symmetrical to each other with respect to the core portion;
the second pad electrodes and the fourth pad electrodes are arranged at positions symmetrical to each other with respect to the core portion;
the substrate further includes a plurality of fifth pad electrodes on the first surface and a plurality of sixth pad electrodes on the second surface;
the memory system further comprises:
  a volatile memory;
  a plurality of fifth electrodes configured to respectively couple the fifth pad electrodes and the volatile memory; and
  a plurality of sixth electrodes configured to respectively couple the sixth pad electrodes and the part; and
the fifth pad electrodes and the sixth pad electrodes are arranged at positions symmetrical to each other with respect to the core portion.

13. The memory system according to claim 12, wherein the substrate further includes a plurality of seventh pad electrodes on the first surface and a plurality of eighth pad electrodes on the second surface, and
the memory system further comprises:
  a power supply control circuit;
  a plurality of seventh electrodes configured to respectively couple the seventh pad electrodes and the power supply control circuit; and
  a plurality of eighth electrodes configured to respectively couple the eighth pad electrodes and the part,
the seventh pad electrodes and the eighth pad electrodes are arranged at positions symmetrical to each other with respect to the core portion.

14. The memory system according to claim 13, wherein a total weight of the memory controller, the nonvolatile memory, the volatile memory, and the power supply control circuit is equal to a weight of the part.

15. The memory system according to claim 14, wherein a center of mass of the memory controller, the nonvolatile memory, the volatile memory, and the power supply control circuit is located at a position symmetrical to a center of mass of the part with respect to the core portion.

16. The memory system according to claim 14, wherein a total weight of the memory controller, the nonvolatile memory, the volatile memory, the power supply control circuit, the first electrodes, the second electrodes, the fifth electrodes, and the seventh electrodes is equal to a total weight of the part, the third electrodes, the fourth electrodes, the sixth electrodes, and the eighth electrodes.

17. The memory system according to claim 13, wherein the substrate further includes a connector having a slit that conforms to peripheral component interconnect express (PCIe).

18. The memory system according to claim 17, wherein the substrate has a shape that conforms to M.2 standard.

19. The memory system according to claim 12, wherein the first electrodes, the second electrodes, the third electrodes, and the fourth electrodes are solder balls.

20. The memory system according to claim 12, wherein the part is a plate-like member containing iron.

21. The memory system according to claim 20, wherein the substrate further includes an interconnect layer that is grounded, and
the part is electrically coupled to the interconnect layer.

22. The memory system according to claim 8, wherein the first electrodes, the second electrodes, the third electrodes, and the fourth electrodes are solder balls.

23. The memory system according to claim 8, wherein the first part and the second part are plate-like members containing iron.

* * * * *